United States Patent
Delcol et al.

(10) Patent No.: US 9,217,786 B2
(45) Date of Patent: Dec. 22, 2015

(54) METHOD FOR DIAGNOSING A VARIABLE RELUCTANCE MAGNETIC DETECTION HEAD, AND DETECTION CIRCUIT

(71) Applicants: CONTINENTAL AUTOMOTIVE FRANCE, Toulouse (FR); CONTINENTAL AUTOMOTIVE GMBH, Hannover (DE)

(72) Inventors: Jean-Pierre Delcol, Tournefeuille (FR); Aurore Desgeorge, Tournefeuille (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 45 days.

(21) Appl. No.: 14/357,675

(22) PCT Filed: Nov. 9, 2012

(86) PCT No.: PCT/EP2012/004671
§ 371 (c)(1),
(2) Date: May 12, 2014

(87) PCT Pub. No.: WO2013/072030
PCT Pub. Date: May 23, 2013

(65) Prior Publication Data
US 2014/0320116 A1    Oct. 30, 2014

(30) Foreign Application Priority Data
Nov. 14, 2011   (FR) ...................... 11 03448

(51) Int. Cl.
*G01B 7/14*  (2006.01)
*G01B 7/30*  (2006.01)
*G01R 35/00* (2006.01)
*F02D 41/00* (2006.01)
(Continued)

(52) U.S. Cl.
CPC .............. *G01R 35/00* (2013.01); *F02D 41/009* (2013.01); *F02D 41/0097* (2013.01);
(Continued)

(58) Field of Classification Search
CPC ....................................................... G01P 3/488
USPC .................................................... 324/207.15
See application file for complete search history.

(56) References Cited

U.S. PATENT DOCUMENTS 6,674,279 B2 *  1/2004  Manlove et al. ............... 324/166
6,909,277 B2 *  6/2005  Wild ............................. 324/166

FOREIGN PATENT DOCUMENTS

| DE | 197 41 780 | 3/1999 |
| EP | 2 518 451 | 10/2012 |
| WO | 2011/078130 | 6/2011 |

OTHER PUBLICATIONS

International Search Report dated Feb. 25, 2013, corresponding to PCT/EP2012/004671.

*Primary Examiner* — Bot Ledynh
(74) *Attorney, Agent, or Firm* — Young & Thompson

(57) ABSTRACT

A variable-reluctance magnetic detection head delivers an electrical signal (Uin) and a rising wavefront of the electrical signal is compared with a first threshold (Th) in order to switch from a first state (B0) to a second state (B1), and a falling wavefront is compared with a second threshold (Tb) lower than the first threshold (Th) in order to switch from the second state (B1) to the first state (B0). In a diagnostics step, the first threshold (Th) or the second threshold (Tb) is modified, bringing these thresholds closer together, and a magnetic detection head is diagnosed as being defective if the duty cycle of the second state (B1) is modified during the diagnostics step by a value higher than a diagnostics threshold predetermined in relation to a reference level.

6 Claims, 2 Drawing Sheets

(51) Int. Cl.
*F02D 41/22* (2006.01)
*G01R 33/12* (2006.01)
*G01D 5/244* (2006.01)
*G01R 31/28* (2006.01)

(52) U.S. Cl.
CPC ............... *F02D 41/222* (2013.01); *G01B 7/30* (2013.01); *G01D 5/24466* (2013.01); *G01R 33/1207* (2013.01); *G01R 31/2829* (2013.01); *Y02T 10/40* (2013.01)

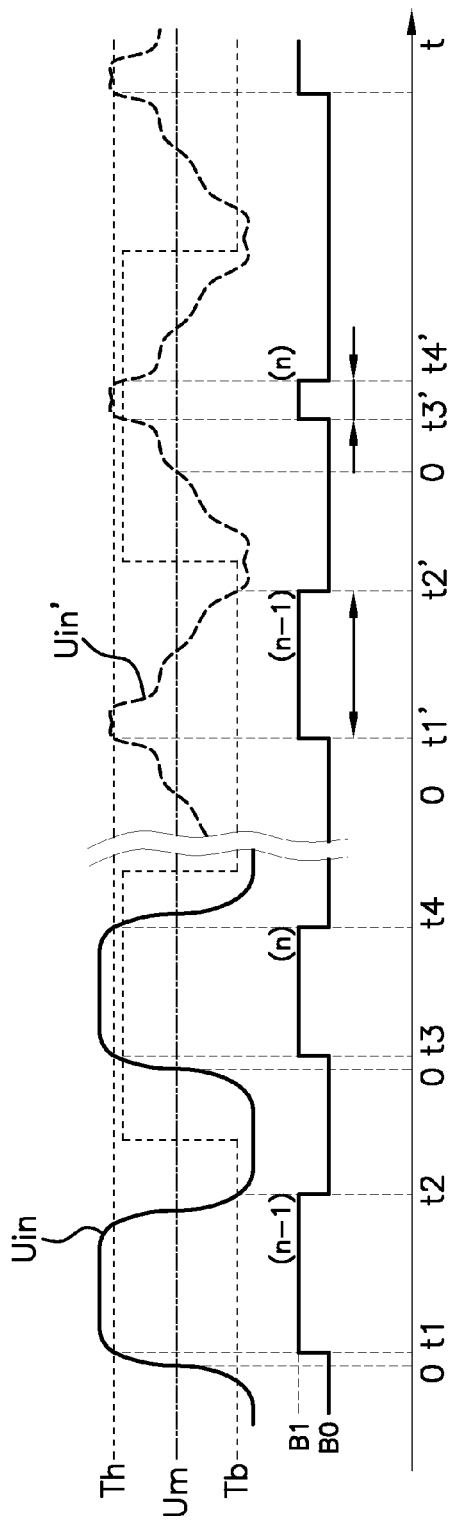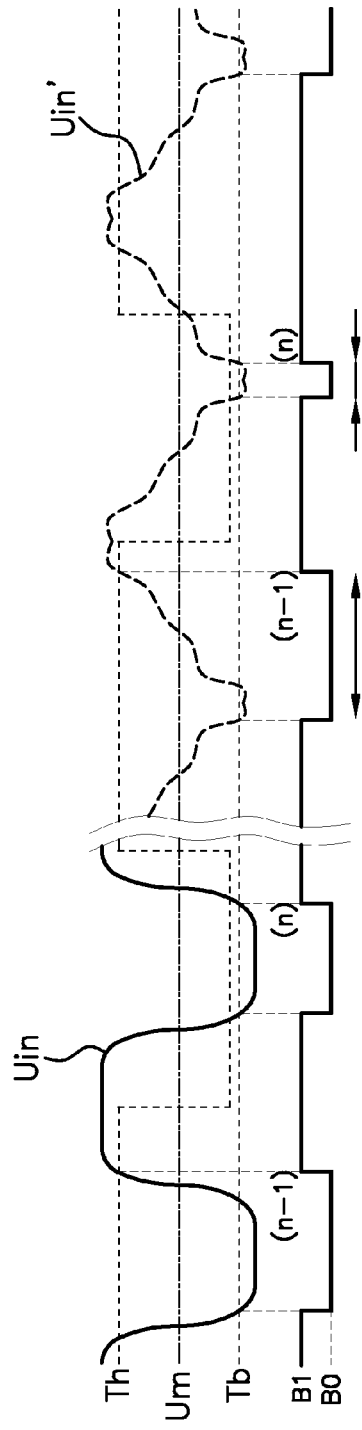

METHOD FOR DIAGNOSING A VARIABLE RELUCTANCE MAGNETIC DETECTION HEAD, AND DETECTION CIRCUIT

The invention relates to a variable-reluctance magnetic detection head diagnostics method, particularly of the type used on an internal combustion engine to measure the position and rotational speed of a key engine component. A further subject of the invention is a circuit implementing the method.

Engines, particularly internal combustion engines, often comprise a system that makes it possible to determine the rotational speed of a key component of said internal combustion engine, such as the crankshaft, and the angular position of this component. This information is used to supervise the operation of the internal combustion engine, particularly the instant that fuel is injected or that combustion of the fuel/oxidant mixture is initiated using a spark plug. Such a system typically comprises a ring gear, fixed to the key component, and a variable-reluctance magnetic detection head connected to a detection circuit. The ring gear comprises several tens of teeth that are evenly spaced except at one location where the gap between two successive teeth differs from the current pitch (for example is twice the current pitch) and where the width of the tooth (or of the gap between two teeth) occupies the space of two normal successive teeth in the example chosen. This location acts as an angular-position marker in order to determine the origin of the scale.

The detection head delivers an electrical signal which is processed by the detection circuit to deliver a binary signal. The detection circuit typically comprises a Schmitt trigger, i.e. a circuit which switches an output from a first state to a second state when the voltage of the input signal exceeds a first threshold, and from the second state to the first state when the voltage of the input signal drops below a second threshold lower than the first threshold. The difference between the first threshold and the second threshold constitutes hysteresis. In operation, the signal on the output is a square wave signal oscillating between the two states, a high state and a low state.

The strive to make internal combustion engines more reliable has led to the provision of monitoring of the sensors in order to diagnose any faults therewith. One of the possible faults in the detection system is the breakage of one of the wires connecting the detection head and the detection circuit. This fault is difficult to diagnose because, as illustrated in FIG. 2, breakage of a wire does not result in the loss of the electrical signal Uin', but causes it to become weaker and deformed with respect to the correct signal Uin. The weakening of the signal is particularly noticeable at low speed, where it causes the signal not to cross the first threshold, meaning that the output signal remains in the first state. The effects of the fault become felt and it then becomes possible to diagnose the absence of the output signal.

However, at higher speeds, a stronger signal is obtained because of parasitic capacitances in the circuit. The first threshold is then crossed and the output delivers a square wave signal, similar to the normal signal, except for a time shift. This shift is, however, not detectable by the system. Diagnostics are therefore no longer possible, despite the presence of the fault.

The invention aims at providing a diagnostics method for a variable-reluctance magnetic detection head such that a fault that is the breakage of a connecting wire between the detection head and a detection circuit can be detected more dependably.

With these objectives in sight, one subject of the invention is a diagnostics method for a variable-reluctance magnetic detection head delivering an electrical signal, whereby a rising wavefront is compared with a first threshold in order to switch from a first state to a second state, and a falling wavefront is compared with a second threshold lower than the first threshold in order to switch from the second state to the first state, the method being notable in that, in a diagnostics step, the first threshold or the second threshold is modified, bringing these thresholds closer together, and a magnetic detection head is diagnosed as being defective if the duty cycle of the second state is modified during the diagnostics step by a value higher than a diagnostics threshold predetermined in relation to a reference level.

It is found that modifying the hysteresis has a significant impact on the duty cycle of the output signal when one of the connecting wires between the detection head and the circuit is disconnected, whereas this modification has practically no effect when no wire is disconnected. This then is an effective way of detecting disconnection and therefore of detecting this type of fault as early on as possible, even before it has had an effect on the operation of the internal combustion engine. A reference duty cycle is first of all determined, as detailed hereinbelow, and the predetermined diagnostics threshold is added to or subtracted from this reference duty cycle. The measured duty cycle is then checked to determine whether it is above or below this calculated value.

According to one particular choice, the reference level is the duty cycle of the second state during a period preceding the diagnostics phase. The diagnostics step is then implemented just after a period that serves as a reference, thus allowing very little time to elapse between the reference and the diagnostics, and therefore leaving very little opportunity for the conditions to evolve between these instants.

According to another choice, the reference level is a mean of the duty cycle of the second state during at least two periods preceding the diagnostics phase. Thus, random variations or disturbances in the measurement that could have an effect over a particular period are avoided.

The diagnostics threshold is, for example, between 0.2 and 0.3. It is found that a variation of this amplitude in the duty cycle is enough to characterize the faulty connection of a wire under all conditions. The choice of the value of the diagnostics threshold is a compromise between a low value, which would flag up as being a fault a variation in the duty cycle due to other causes, and a high value, which might not be able to flag up a true fault.

In the case of a magnetic detection head of a system for an internal combustion engine fitted with a toothed wheel opposite which the head is positioned, the detection phase is commanded once per period of at least one revolution. This frequency is high enough to manage any faults that might occur.

Another subject of the invention is a detection circuit to which a variable-reluctance magnetic detection head is intended to be connected in order to deliver an electrical signal to it, the circuit comparing a rising wavefront of the electrical signal with a first threshold in order to switch from a first state to a second state, and a falling wavefront with a second threshold lower than the first threshold in order to switch from the second state to the first state, the detection circuit being notable in that it is configured to implement a diagnostics step by modifying the first or second threshold, bringing these closer together, and diagnosing that a detection head is defective if the duty cycle of the second state is modified during the diagnostics step by a value higher than a diagnostics threshold predetermined in relation to a reference level.

The invention will be better understood and other specifics and advantages will become apparent from reading the following description, the description referring to the attached drawings in which:

FIG. 3 is also a timing diagram similar to FIG. 2, during implementation of a first embodiment of the invention;

FIG. 4 is a timing diagram similar to FIG. 3, during implementation of a second embodiment of the invention.

Figure 1:
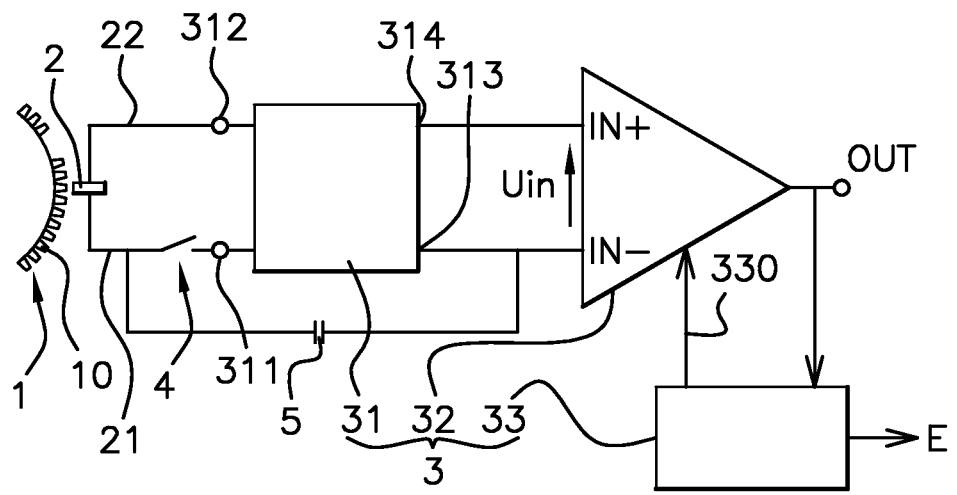
FIG. 1 is a schematic view of a system comprising a detection circuit according to the invention.

Reference is made to FIG. 1 which depicts a system comprising a toothed wheel 1 of an internal combustion engine, a variable-reluctance magnetic detection head 2 and a detection circuit 3 to which the magnetic detection head 2 is connected. The detection circuit 3 comprises an interface device 31 and a Schmitt trigger 32 which delivers an output signal OUT. The detection circuit 3 also comprises a diagnostics circuit 33 which is connected as input to the output signal OUT of the Schmitt trigger 32 and which delivers an error signal E.

The toothed wheel 1 in the conventional way comprises a series of teeth 10 evenly distributed at the periphery of the wheel 1. The magnetic detection head 2 faces the periphery of the toothed wheel 1 and has two connection wires 21, 22 for connection to the interface device 31 at two input terminals 311, 312. The interface device 31 also comprises two output terminals 313, 314 which are connected to two inputs IN−, IN+ of the Schmitt trigger 32. The Schmitt trigger 32 also receives a command 330 from the diagnostics circuit 33 in order to drive the high threshold Th and low threshold Tb of the Schmitt trigger 32, which are also respectively known hereinafter as the first threshold and the second threshold.

FIG. 1 depicts a switch 4 on one of the wires 21 that connect the magnetic detection head 2 to the interface device 31. This switch 4 symbolizes a fault with the connection wire 21 which results in the connection becoming broken. A capacitor 5 has also been depicted to symbolize a parasitic capacitance which creates coupling between the magnetic detection head 2 and the input IN− of the Schmitt trigger 32.

Current operation of the system of FIG. 1, that is to say operation with the switch 4 closed, is described with reference to FIG. 2. As the teeth 10 move past the magnetic detection head 2, a periodic electrical signal Uin is generated, in the known way, between the output terminals 313, 314 of the interface circuit 31 and this periodic signal is of substantially square wave form. The start of the period, i.e. the moment at which the electrical signal Uin crosses the mean voltage Um is adopted as the time reference. The Schmitt trigger 32 compares the electrical signal Uin with the first threshold Th in a rising direction and with the second threshold Tb in a falling direction. The Schmitt trigger 32 therefore adopts two states (cf. the OUT signal) and switches from a first state B0 to a second state B1 when the electrical signal Uin exceeds a first threshold Th at the moment t1, and from the second state B1 to the second state B0 when the electrical signal Uin drops below a second threshold Tb lower than the first threshold Th at the moment t2.

Figure 2:
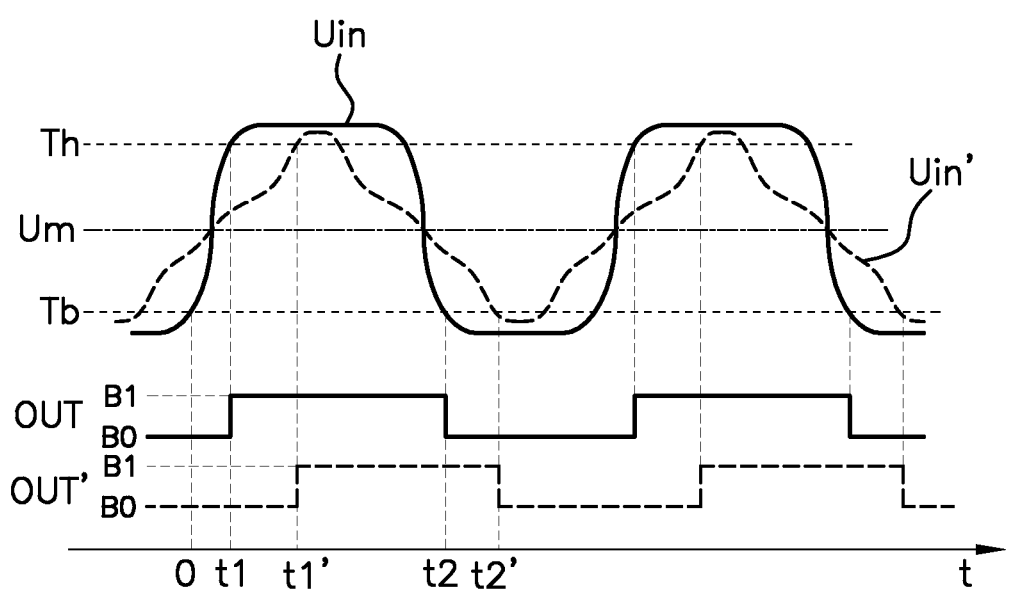
FIG. 2 is a timing diagram showing signals generated by a variable-reluctance magnetic detection head before and after a Schmitt trigger, in the case of a detection head that is connected and one that is disconnected.

In the event of a faulty connection, when the switch 4 is open, an electrical signal Uin' is observed that is no longer of square wave form, but which does remain periodic, as depicted in dotted line in FIG. 2. The Schmitt trigger 32 flips between the first state B0 and the second state B1 at a moment t1' that is later than the moment t1, and the trigger flips between the second state B1 and the first state B0 at a moment t2', likewise later than the moment t2. The duration of the period and the durations t2−t1 and t2'−t1' of the passage to the second state B1 are substantially identical in both instances. The signal OUT' is simply shifted by the value t1'−t1, and this is not detectable. The duty cycle of the second state B1, defined by the duration of the second state B1 of the trigger divided by the duration of the period, is substantially equal to 0.5, because the trigger spends more or less as long in the first state B0 as it does in the second state B1.

In a diagnostics step according to a first embodiment implemented cyclically and preceded by a reference step, the diagnostics circuit 33 commands the second threshold Tb to bring it closer to the first threshold Th, as shown in FIG. 3. The difference between the two thresholds Th-Tb is, for example, reduced to 10% of the normal value observed outside of the diagnostics phase. If the magnetic detection head 2 is in good working order, i.e. if the switch 4 is closed, the signal Uin has a substantially square wave shape, as shown in the left-hand part of the diagram. During the reference step n-1, on the extreme left of the diagram of FIG. 3, the duty cycle of the second state B1 is substantially 0.5 as indicated earlier, and acts as a reference level. During the diagnostics step n, it is found that the first threshold Th is crossed at the moment t3, identical to t1, and that the second threshold Tb is crossed at the moment t4, slightly earlier than the moment t2. The duty cycle of the second state B1 is slightly reduced to 0.4. This reduction by 0.1 by comparison with the reference level is below a diagnostics threshold S equal to 0.2. The diagnostics conclude that there is no fault and the error signal E remains in the first state B0.

By contrast, if the magnetic detection head 2 is disconnected, i.e. if the switch 4 is open, the electrical signal Uin' has a shape appreciably different from the square wave shape, with progressive rising and falling signal wave fronts, as shown in the right-hand part of the diagram of FIG. 3. During the reference step n-1 in the left-hand part of the diagram, the duty cycle of the second state B1 is substantially 0.5 as indicated previously and acts as a reference level. During the diagnostics step n, in the right-hand part of the diagram, it is found that the first threshold Th is crossed at the moment t3', later than the moment t1', and that the second threshold Tb is crossed at the moment t4', earlier than the moment t2'. The duty cycle of the second state B1 is greatly reduced to 0.1. This reduction by 0.4 by comparison with the reference level is above the diagnostics threshold S. The diagnostics conclude that there is a fault and the error signal E switches to the second state B1 to flag up the fault.

In a second embodiment, shown in FIG. 4, it is the first threshold Th that is modified during the diagnostics step by the diagnostics circuit 33 so that the difference between the thresholds Th, Tb is reduced to 10% of the previous value. Using reasoning similar to that of the first embodiment, it is found that the duty cycle of the second state B1 during the diagnostics step changes from 0.5 to 0.6 which is a variation with respect to the reference level by 0.1, which is below the diagnostics threshold S when the switch 4 is closed, whereas it changes to 0.9 when the switch 4 is open, representing a variation by 0.4, which is above the diagnostics threshold S. In this embodiment, diagnostics are likewise correctly effected.

The diagnostics step is implemented cyclically, for example once every revolution of the toothed wheel 1, or once every n revolutions, n being an integer greater than or equal to two. The reference level could be established in a different way, for example using a default value or taking an average over several previous measurements. If the diagnostics threshold S has been chosen to be 0.3, diagnostics are performed in the same way. This diagnostics level could be modified upwards or downwards without departing from the scope of the invention.

The invention claimed is:

1. A diagnostics method for a variable-reluctance magnetic detection head (2) delivering an electrical signal (Uin), whereby a rising wavefront is compared with a first threshold (Th) in order to switch from a first state (B0) to a second state (B1), and a falling wavefront is compared with a second threshold (Tb) lower than the first threshold (Th) in order to switch from the second state (B1) to the first state (B0), characterized in that, in a diagnostics step, the first threshold (Th) or the second threshold (Tb) is modified, bringing these thresholds closer together, and a magnetic detection head (2) is diagnosed as being defective if the duty cycle of the second state (B1) is modified during the diagnostics step by a value higher than a diagnostics threshold (S) predetermined in relation to a reference level.

2. The method as claimed in claim 1, whereby the reference level is the duty cycle of the second state (B1) during a period (n-1) preceding the diagnostics phase (n).

3. The method as claimed in claim 1, whereby the reference level is a mean of the duty cycle of the second state (B1) during at least two periods preceding the diagnostics phase (n).

4. The method as claimed in claim 1, whereby the diagnostics threshold (S) is between 0.2 and 0.3.

5. The method as claimed in claim 1, for a magnetic detection head (2) of a system for an internal combustion engine fitted with a toothed wheel (1) opposite which the head is positioned, whereby the diagnostics phase (n) is commanded once per period of at least one revolution.

6. A detection circuit (3) to which a variable-reluctance magnetic detection head (2) is intended to be connected in order to generate an electrical signal (Uin), the circuit comparing a rising wavefront of the electrical signal (Uin) with a first threshold (Th) in order to switch from a first state (B0 to a second state (B1), and a falling wavefront with a second threshold (Tb) lower than the first threshold (Th) in order to switch from the second state (B1) to the first state (B0), characterized in that it is configured to implement a diagnostics step (n) by modifying the first or second threshold (Th, Tb), bringing these closer together, and diagnosing that a detection head (2) is defective if the duty cycle of the second state (B1) is modified during the diagnostics step (n) by a value higher than a diagnostics threshold (S) predetermined in relation to a reference level.

* * * * *